United States Patent
Guo

(10) Patent No.: US 10,872,827 B2
(45) Date of Patent: Dec. 22, 2020

(54) MANUFACTURING METHOD AND EVALUATION METHOD FOR SIC DEVICE

(71) Applicant: SHOWA DENKO K.K., Tokyo (JP)

(72) Inventor: Ling Guo, Chichibu (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 16/514,114

(22) Filed: Jul. 17, 2019

(65) Prior Publication Data

US 2020/0027797 A1    Jan. 23, 2020

(30) Foreign Application Priority Data

Jul. 19, 2018    (JP) ................. 2018-136251

(51) Int. Cl.
| | | |
|---|---|---|
| *G01N 27/00* | (2006.01) | |
| *H01L 21/66* | (2006.01) | |
| *G01N 21/64* | (2006.01) | |
| *G01N 21/95* | (2006.01) | |
| *H01L 21/04* | (2006.01) | |

(52) U.S. Cl.
CPC ......... *H01L 22/12* (2013.01); *G01N 21/6489* (2013.01); *G01N 21/9501* (2013.01); *G01N 27/00* (2013.01); *H01L 22/14* (2013.01); *H01L 21/046* (2013.01)

(58) Field of Classification Search
None
See application file for complete search history.

(56) References Cited

U.S. PATENT DOCUMENTS

2015/0168311 A1* 6/2015 Seki ................... G01N 21/9501
356/51

FOREIGN PATENT DOCUMENTS

| JP | 2011-220744 A | 11/2011 |
|---|---|---|
| JP | 2015-056583 A | 3/2015 |
| JP | 2016-025241 A | 2/2016 |
| JP | 2017-011100 A | 1/2017 |

* cited by examiner

*Primary Examiner* — Bradley Smith
(74) *Attorney, Agent, or Firm* — Sughrue Mion, PLLC

(57) ABSTRACT

Provided is a manufacturing method for a SiC device including: performing an ion implantation process of implanting ions in an epitaxial layer of a SiC epitaxial wafer that has the epitaxial layer; and performing an evaluation process of evaluating a defect of the SiC epitaxial wafer after the ion implantation process, in which the evaluation process includes a surface inspection process of inspecting a surface of the SiC epitaxial wafer, a PL inspection process of irradiating a region that includes the defect detected in the surface inspection to perform photoluminescence measurement after the surface inspection process, and a determination process of determining a degree of the defect from a surface defect image detected in the surface inspection and a PL defect image detected in the PL inspection process.

6 Claims, 4 Drawing Sheets

(a)

(b)

MANUFACTURING METHOD AND EVALUATION METHOD FOR SIC DEVICE

BACKGROUND OF THE INVENTION

Field of the Invention

The invention relates to a manufacturing method and an evaluation method for a SiC device.

Priority is claimed on Japanese Patent Application No. 2018-136251, filed on Jul. 19, 2018, the content of which is incorporated herein by reference.

Description of Related Art

Silicon carbide (SiC) has characteristic properties. For example, a breakdown electric field thereof is greater than that of silicon (Si) by one order of magnitude, a bandgap thereof is greater than that of silicon (Si) by three times, and heat conductivity is higher than that of silicon (Si) by about three times. Therefore, there has been an expectation for applications of silicon carbide (SiC) to power devices, high-frequency devices, high-temperature operating devices, and the like.

However, SiC devices still have a lot of problems to be solved.

One of the problems is to increase efficiency of a manufacturing process, and an improvement in a yield is also one of the problems. Since SiC crystal growth technologies are still being developed in present, there may be a lot of crystal defects in substrates. Such crystal defects may serve as device killer defects that may degrade properties of the SiC devices and may become a severe factor of prevention of an increase in the yield.

Examples in which crystal defects degrade properties of a SiC device include defective electric strength, oxide film breakage, and the like. The invention described in Japanese Unexamined Patent Application, First Publication No. 2016-25241 includes a process of specifying a position of a defect portion in a SiC epitaxial wafer. The position of the defect portion is specified through photoluminescence measurement. The SiC epitaxial wafer in which the defect portion has been specified is subjected to electric strength measurement after an element is provided.

An invention was made for the purpose of improving a yield of manufacturing of a semiconductor thin film as well as the invention described in Japanese Unexamined Patent Application, First Publication No. 2016-25241. Japanese Unexamined Patent Application, First Publication No. 2015-56583 describes an evaluation device adapted to predict and estimate mobility and stress resistance of an oxide semiconductor thin film. The measurement is performed through photoluminecense measurement.

Japanese Unexamined Patent Application, First Publication No. 2011-220744 discloses a defect evaluation method of determining a defect region that includes a 6H-type lamination structure in a SiC bulk monocrystal substrate. The defect evaluation is performed through photoluminescence measurement. The 6H-type lamination structure is known as a factor defect that may cause current leakage.

Japanese Unexamined Patent Application, First Publication No. 2017-11100 discloses a defect detection method of specifying a position of a crystal defect through photoluminescence measurement. The defect detection method is characterized by irradiating a semiconductor sample with excitation light and scanning the semiconductor sample with respect to the excitation light.

SUMMARY OF THE INVENTION

However, it is not possible to sufficiently specify defects that may affect devices according to the photoluminescence measurement described in Japanese Unexamined Patent Application, First Publication Nos. 2016-25241 and 2015-56583. For example, it is not possible to discover a defect such as breakage of an oxide film due to scratching. The defect portion where the breakage of the oxide film has occurred may become a reason of leakage.

The photoluminescence measurement described in Japanese Unexamined Patent Application, First Publication Nos. 2011-220744 and 2017-11100 is performed on a SiC ingot or a SiC wafer. Therefore, it is not possible to specify a process defect that has occurred in a process of forming a device on a SiC wafer.

It is desirable to obtain a manufacturing method for a SiC device that enables easy detection of a defect that occurs at in the course of a process.

The inventors discovered that it was possible to classify a defect that was attributable to defective electric strength or oxide film breakage in the surface defect image and a defect that was not attributable to defective electric strength or oxide film breakage by matching the surface defect image detected in the surface inspection and the PL defect image detected in the PL inspection process, as a result of intensive review. The present invention provides the following mechanism to achieve the aforementioned objective.

(1) According to a first aspect, there is provided a manufacturing method for a SiC device including: performing an ion implantation process of implanting ions in an epitaxial layer of a SiC epitaxial wafer that has the epitaxial layer; and performing an evaluation process of evaluating a defect of the SiC epitaxial wafer after the ion implantation process, in which the evaluation process includes a surface inspection process of inspecting a surface of the SiC epitaxial wafer, a PL inspection process of irradiating a region that includes the defect detected in the surface inspection with excitation light to perform photoluminescence measurement after the surface inspection process, and a determination process of determining a degree of the defect from a surface defect image detected in the surface inspection and a PL defect image detected in the PL inspection process.

(2) The manufacturing method for a SiC device according to the aforementioned aspect may further include: performing an electric strength measurement process of applying a voltage to each produced SiC device to perform electric strength measurement after the evaluation process.

(3) In the PL inspection process according to the aforementioned aspect, the defect evaluated in the evaluation process may be determined as being defective in a case in which a ratio between luminance S at a light emitting portion that emits light and light emitting intensity N at a light non-emitting portion that does not emit light is equal to or greater than 4.0.

(4) In the PL inspection process according to the aforementioned aspect, the defect evaluated in the evaluation process may be determined as being defective in a case in which the ratio between the luminance S at the light emitting portion that emits light and light emission intensity N at the light non-emitting portion that does not emit light is equal to or greater than 2.0.

(5) According to a second aspect, there is provided an evaluation method for a SiC device including: performing a surface inspection process of inspecting a surface of a SiC epitaxial wafer; performing a PL inspection process of irradiating the surface of the SiC epitaxial wafer with excitation light to perform photoluminescence measurement; and performing a determination process of determining a degree of defect from a surface defect image detected in the surface inspection and a PL defect image detected in the PL inspection process.

According to the manufacturing method for a SiC device in the aforementioned aspect, it is possible to easily detect a defect that has occurred in the course of a process of manufacturing a SiC device.

DETAILED DESCRIPTION OF THE INVENTION

Figure 1:
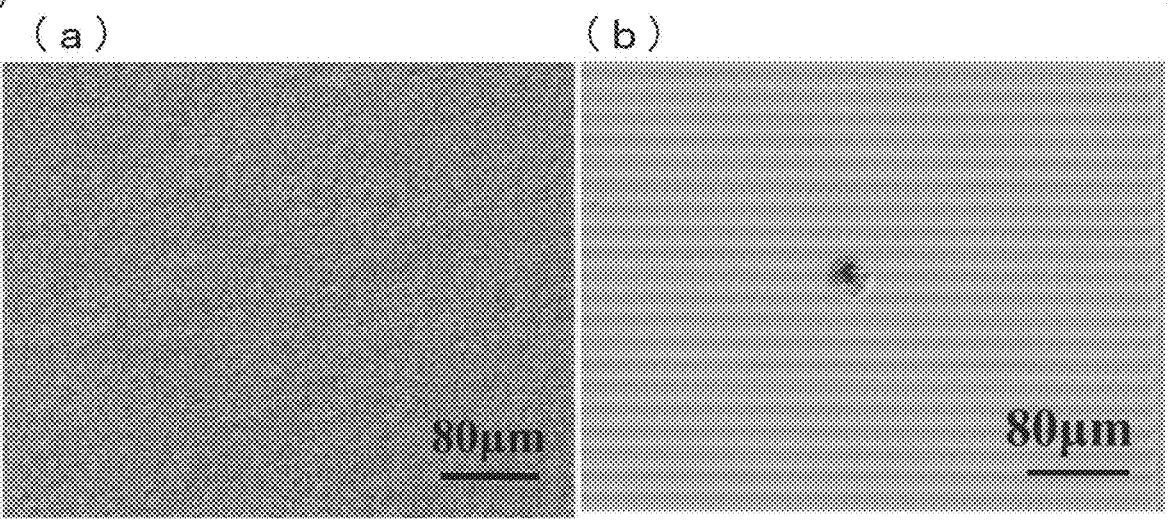
FIG. 1 illustrates a surface inspection image (left) of a SiC wafer before an ion implantation process and a surface inspection image (right) of a SiC epitaxial wafer during a surface inspection process, and this is a schematic surface view of the SiC epitaxial wafer after the ion implantation process.

Hereinafter, an embodiment of the invention will be described in detail with reference to the drawings as needed. The drawings used in the following description may illustrate characteristic parts in an enlarged manner for convenience for the purpose of easy understanding of features of the invention, and dimensional ratios and the like of the respective components may differ from those in practice. Materials, dimensions, and the like exemplified in the following description are just examples, and the invention is not limited thereto and can be appropriately modified without changing the gist thereof.

"Manufacturing Method for SiC Device"

A manufacturing method for a SiC device according to the embodiment includes an ion implantation process and an evaluation process. Hereinafter, the manufacturing method for a SiC device will be specifically described. Hereinafter, the processes of the manufacturing method for a SiC device will be described in detail for each process.

(Wafer Preparation Process)

First, a SiC substrate is prepared. The SiC substrate is obtained by slicing a monocrystalline SiC ingot. Then, epitaxial layer of SiC are laminated on one surface of the SiC substrate. The SiC substrate with the epitaxial layer laminated thereon will be referred to as a SiC epitaxial wafer.

(Ion Implantation Process)

In the ion implantation process, ions are implanted in the epitaxial layer of the SiC epitaxial wafer. The portion of the epitaxial layer with the ions implanted therein serves as a p-type or n-type semiconductor. In a case of the p-type, ions of aluminum, boron, or the like are implanted as impurity ions in the epitaxial layer. In a case of the n-type, ions of phosphorous, nitrogen, or the like are implanted as impurity ions in the epitaxial layer. The portions in which the ions have been implanted serve as a source region or a drain region of a MOSFET, for example. The ion implantation process is performed a plurality of times in a divided manner while patterning is performed on one surface of the SiC epitaxial wafer.

In the ion implantation process, crystal defects may occur. The crystal defects may become a reason of defective electric strength of the SiC device.

After the ion implantation process, a carbonized film formation process, an active annealing process, an oxidation process, and an oxide film peeling process are performed.

The carbonized film formation process is performed in the following procedure. First, both surfaces of the wafer are coated with a resist. Then, the wafer is subjected to hard baking. Further, a high-temperature treatment is performed on the resist film applied to the both surfaces of the wafer in an Ar atmosphere, thereby forming a carbonized film. The carbonized film serves as a protective film that protects the SiC epitaxial wafer.

In the active annealing process, the SiC epitaxial wafer is heated at a predetermined temperature. Impurities implanted in the epitaxial layer through the active annealing are activated and become carriers. In the oxidation process, oxidation of both the sides of the SiC wafer is performed.

The oxidation process is performed in order to eliminate the carbonized film.

In the oxide film peeling process, a formed oxide film is peeled. Although not limited to this example, in the oxide film peeling process, for example, the oxide film is peeled through a hydrofluoric acid treatment. The oxide film has poor film quality and includes a lot of particles on the surface thereof. A SiC epitaxial wafer with high quality is obtained by peeling the oxide film.

Adhesion of particles in the carbonized film formation process, the active annealing process, the oxidation process, and the oxide film peeling process is a defect that may become a reason of a defective SiC device.

There is also a case in which the protective film is not appropriately formed in the carbonized film formation process. If the protective film is not appropriately formed, this may become a reason of scratching or the like generated in the SiC epitaxial layer. The scratching or the like may become a reason of a defective SiC device.

(Evaluation Process)

In the manufacturing method for a SiC device according to the embodiment, an evaluation process is performed after the ion implantation process. The evaluation process includes a surface inspection process, a PL inspection process, and a determination process.

(Surface Inspection Process)

In the surface inspection process, defects (scratching) on the surface of the SiC epitaxial wafer are detected after the ion implantation process is performed.

In the surface inspection process, reflected light of light that has been incident on the surface of the SiC epitaxial wafer is measured. The surface inspection process is performed using an optical microscope, an electronic microscope, a scanning probe microscope, or the like. In the surface inspection process, defects with widths of 1 μm to 1000 μm are detected. Types of defects with widths of 10 μm to 1 mm among the defects can be classified through an optical inspection performed in the surface inspection. The types of defects that can be classified include Downfall, Carrot, Large-pit, linear defects, triangular defects, scratching, shallow scratching, pits, and the like.

FIG. 1 is a diagram illustrating states in which surface inspection has been performed on surfaces at the same location of a SiC epitaxial layer before the ion implantation process and the SiC epitaxial layer during the surface inspection process. The left diagram in FIG. 1 (FIG. 1 (a)) is a surface image of the SiC epitaxial layer before the ion implantation process. The right diagram in FIG. 1 (FIG. 1 (b)) is a surface image of the SiC epitaxial layer measured in the surface inspection process. As illustrated in the left diagram in FIG. 1 (FIG. 1 (a)), no defects are observed before the ion implantation process. That is, this defect shown in the right diagram in FIG. 1 (FIG. 1 (b)) is a defect that has occurred due to the process in or after the ion implantation process.

It is possible to specify position coordinates of such a defect through the surface inspection process. The entire surface of the substrate is observed by a surface inspection apparatus with reference to an orientation flat portion of the SiC epitaxial wafer, and the position coordinates of the defect are specified, for example. In the surface in section process, a reference for observing the SiC epitaxial wafer is arbitrarily selected. The manufacturing method for a SiC device and the evaluation method a SiC device according to the present embodiment may perform surface inspection on the surface of the SiC epitaxial wafer before the ion implantation process for comparison. The surface inspection of the SiC epitaxial wafer before the ion implantation step can be performed in the same manner as the surface inspection step.

(PL Inspection Process)

In the PL inspection process, PL measurement is performed on the SiC epitaxial wafer on which ion implantation has been performed. In the PL inspection process, a photoluminescence inspection device is used. A wavelength of excitation light in the inspection may range from 270 nm to 380 nm. The wavelength is preferably from 310 nm to 365 nm and is further preferably 365 nm. A helium-cadmium (He—Cd) laser (λ=325 nm), a mercury-xenon (Hg—Xe) ultraviolet (UV) lamp (λ=314 nm), an N2 laser (λ=365 nm), or the like can be used as excitation light.

A wavelength of received light is preferably from 420 nm to 750 nm and is further preferably 660 nm. The wavelength of received light can be controlled using a low path band filter or the like. The low path band filter is a filter that blocks waves with wavelengths that are equal to or less than a specific wavelength. It is possible to remove light emission caused for reasons other than predetermined defects, by controlling the wavelength of received light.

Figure 2:
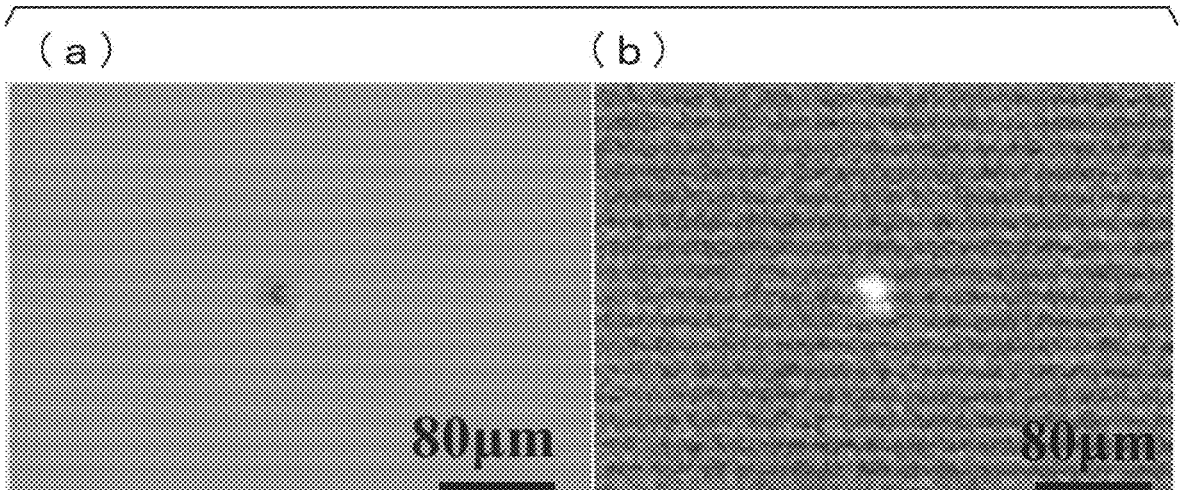
FIG. 2 is a surface defect image (left) at a certain position on a SiC epitaxial wafer and a PL defect image obtained by observing the same position.
Figure 3:
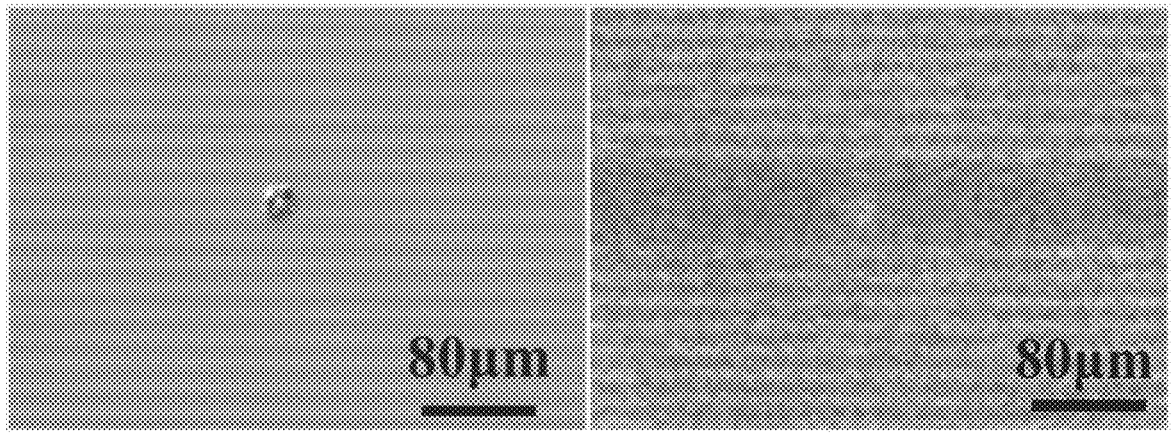
FIG. 3 is a surface defect image (left) at a certain position on a SiC epitaxial wafer and a PL defect image obtained by observing the same position.
Figure 4:
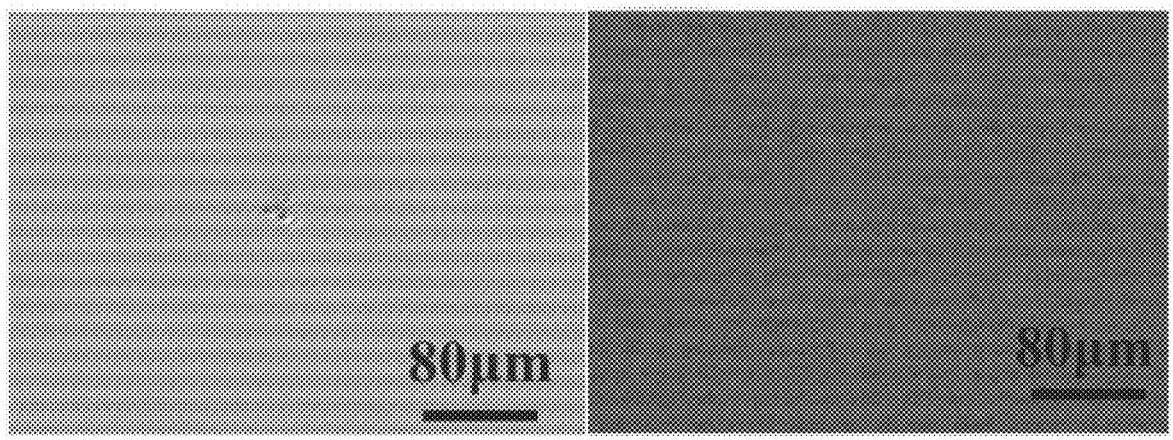
FIG. 4 is a surface defect image (left) at a certain position on a SiC epitaxial wafer and a PL defect image obtained by observing the same position.

The PL inspection process according to the embodiment is performed on the region that includes the defects detected in the surface inspection process. FIGS. 2 to 4 are images illustrating states in which PL inspection has been performed on the region that includes the defects detected in the surface inspection process. In FIGS. 2 to 4, the left diagrams (FIG. 2 (a), FIG. 3 (a), FIG. 4 (a)) are surface inspection images of a defect, and the right diagrams (FIG. 2 (b), FIG. 3 (b), FIG. 4 (b)) are PL inspection images obtained by performing PL inspection on the same location. FIGS. 2 to 4 (FIG. 2 (a) and FIG. 2 (b), FIG. 3 (a) and FIG. 3 (b) and FIG. 4(a) and FIG. 4 (b)) are images of the subjected to the inspection.

In the PL inspection image illustrated in the right diagram in FIG. 2(FIG. 2 (b)), a bright spot that appears as a white spot is present at the same position as the defect confirmed in the surface inspection image. In the PL inspection image illustrated in the right diagram in FIG. 3(FIG. 3 (b)), a bright spot that appears as a slightly white point is present at the same position as the defect in the surface inspection image although the spot is not as bright as PL inspection image in the right diagram in FIG. 2(FIG. 2 (b)). In the PL inspection image illustrated in the right diagram in FIG. 4(FIG. 4 (b), no bright spot is observed at the same position as the defect confirmed in the surface inspection.

In general, photoluminescence light detected in the PL inspection is light that is generated when electrons excited from a valence band to a conduction band by excitation light returns to the valence bond. Therefore, light is not limited merely because a surface defect is present. Therefore, strong light may be emitted as illustrated in the right diagram in FIG. 2 (FIG. 2 (b)) in some cases while no light may be emitted as illustrated in the right diagram in FIG. 4 (FIG. 4 (b)) in other cases.

Figure 5:
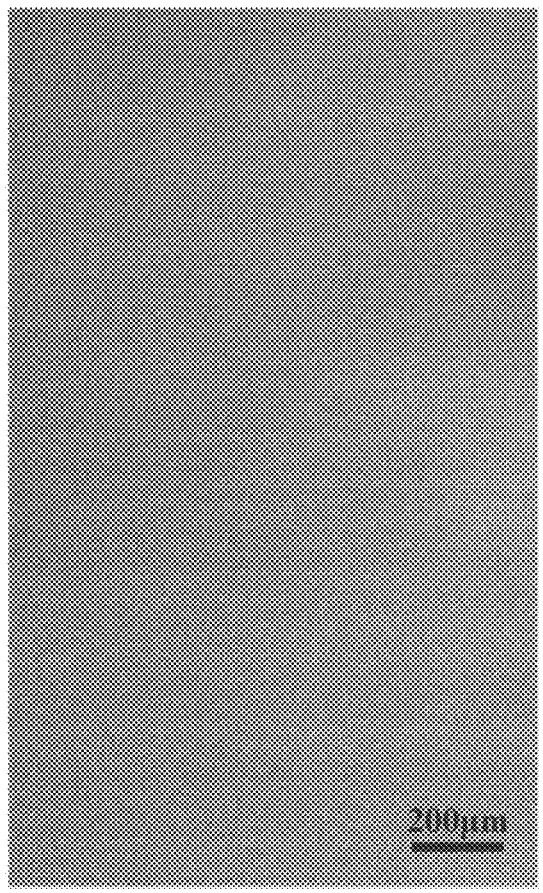
FIG. 5 is a surface inspection image (left) at a certain position on a SiC epitaxial wafer and a PL inspection image obtained by observing the same position.
Figure 5:
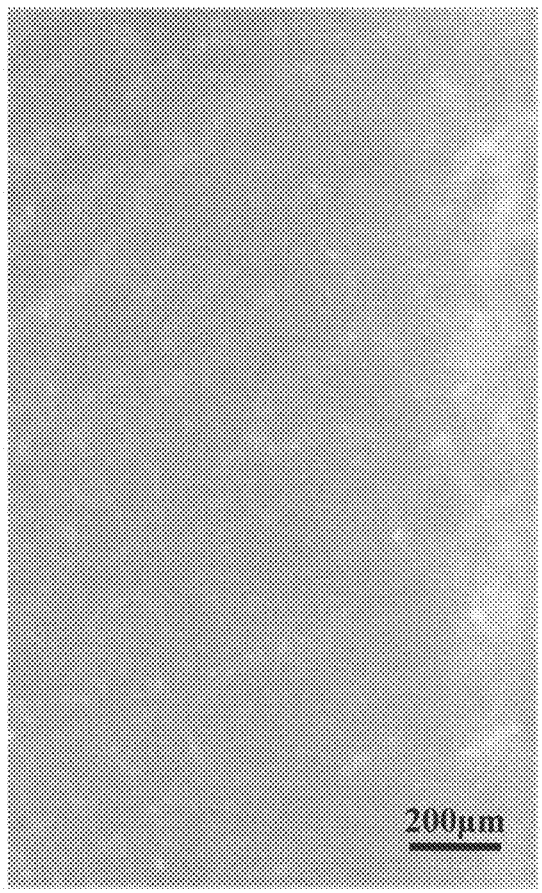

On the contrary, the photoluminescence light is also observed in a location where no defect is present on the surface. FIG. 5 is an image obtained by performing surface inspection and PL inspection on the substrate. The left diagram in FIG. 5 (FIG. 5 (a)) is a surface inspection image, and the right diagram in FIG. 5 (FIG. 5 (b)) is a PL inspection image. Regardless of the left diagram in FIG. 5 (FIG. 5 (a)) in which no surface defect has been detected, photoluminescence light that appears like white haze is measured in the right diagram (FIG. 5 (b)). In other words, light emission caused by a surface defect as illustrated in the right diagram in FIG. 2 (FIG. 2 (b)) and light emission caused by the inside of the epitaxial layer as illustrated in the right diagram in FIG. 5 (FIG. 5 (b)) are measured in a case in which only the PL inspection is performed, and it is not possible to separate the light emission from each other.

(Determination Process)

In the determination process, a degree of defect is determined from the defect image detected in the surface inspection process and the PL defect image detected in the PL inspection process.

As illustrated in FIGS. 2 to 4, there may be difference in how similar defects appear in the PL inspection process even if such similar defects are detected in the surface inspection process. The inventors discovered a correlation between how defects appear in the PL inspection process and oxide film breakage and defective electric strength in a SiC device.

Figure 6:
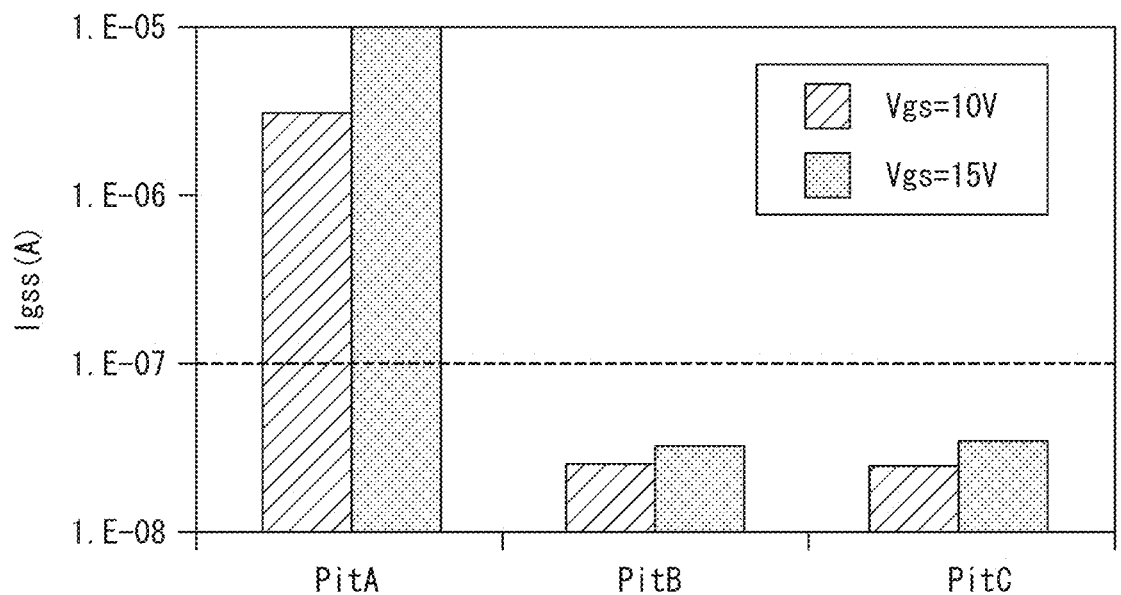
FIG. 6 illustrates results obtained by measuring leakage currents Igss between gates and sources of the respective devices with the defects observed in FIGS. 2, 3, and 4.
Figure 7:
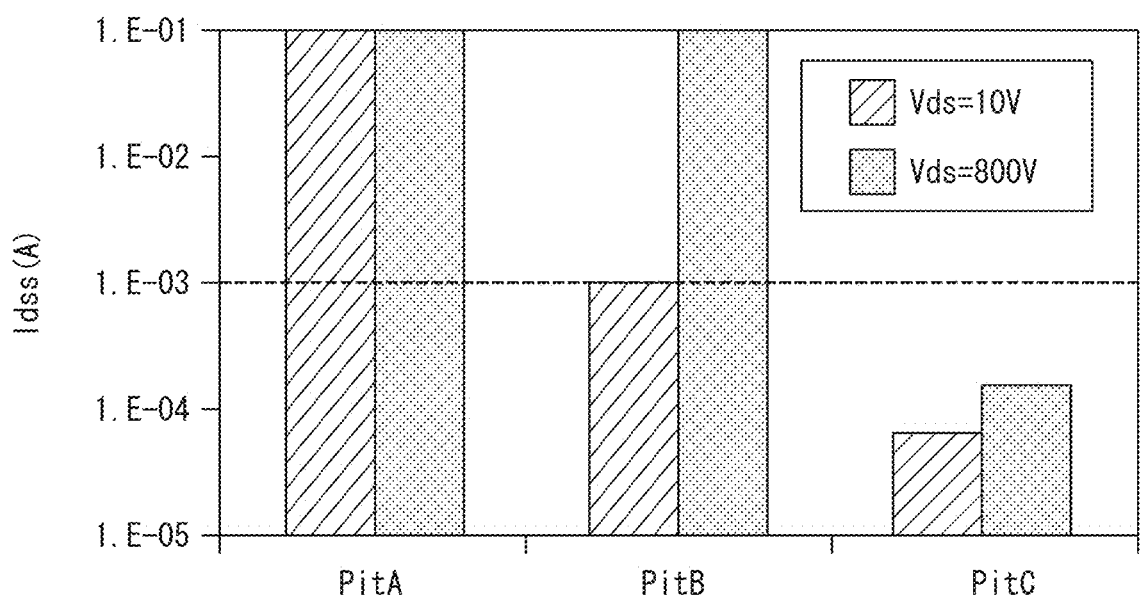
FIG. 7 illustrates results obtained by measuring drain disconnecting currents Idss of the respective devices with the defects observed in FIGS. 2, 3, and 4.

FIG. 6 illustrates a result of an oxide film breakage test performed on defects specified in the surface inspection process. FIG. 7 illustrates a result of an electric strength leakage test performed on defects specified in the surface inspection process. In FIGS. 6 and 7, PitA is a defect in which strong light emission is observed in the PL inspection image shown in the right diagram in FIG. 2 (FIG. 2 (b)), PitB is a defect from which weak light emission is observed in the PL inspection image shown in the right diagram in FIG. 3 (FIG. 3 (b)), and PitC is a defect from which no light emission is observed in the PL inspection image shown in the right diagram in FIG. 4 (FIG. 4 (b)).

The oxide film breakage test and the electric strength leakage test were performed on a metal-oxide-semiconductor field-effect transistor (MOSFET) which was produced as a SiC device. It was determined whether or not oxide film breakage occurred in the created device by measuring a leakage current (Igss) between a gate and a source. A drain and the source were short-circuited, and a voltage Vgs was applied between the gate and the source. Two patterns of voltage, namely 10 V and 15 V were applied.

Also, it was determined whether or not defective electric strength occurred in the created device by measuring a drain disconnecting current (Idss). The gate and the source were short-circuited, and a voltage was applied between the drain and the source. Two patterns of voltage, namely 10 V and 800 V were applied.

As illustrated in FIGS. 6 and 7, oxide film breakage and defective electric strength occurred at PitA. No oxide film breakage occurred while defective electric strength occurred at PitB when the voltage of 800 V was applied. Neither oxide film breakage nor defective electric strength occurred at PitC. In other words, it was possible to determine the degree of defect by performing the PL inspection on the defect specified in the surface inspection. Here, a threshold value of the leakage current between the gate and the source which led to oxide film breakage was set to $1.0 \times 10^{-7}$ A, and a threshold value of the drain disconnecting current which lead to defective electric strength was set to $1.0 \times 10^{-3}$ A. Note that these threshold values can appropriately be set in accordance with required performance.

Here, although the degree of light emission in the PL inspection image may be visually analyzed from the obtained measurement image, it is preferable to make a determination from a contrast ratio between the defect and a normal portion in order to enhance exactness. It is possible to automate detection using the contrast ratio.

In the PL defect image illustrated in the right diagram in FIG. 2 (FIG. 2 (b)), a ratio (S/N ratio) between luminance S at the light emitting portion (PitA) that emits light and light emission intensity N at a light non-emitting portion that does not emit light is 9.00527. In the PL defect image illustrated in the right diagram in FIG. 3 (FIG. 3 (b)), the S/N ratio at the light emitting portion (PitB) that emits light is 3.07779. In the PL defect image illustrated in the right diagram in FIG. 4 (FIG. 4 (b)), the S/N ratio at the light emitting portion (PitC) that emits light is 1.67965.

Therefore, it is preferable to determine defects as being defective in a case in which S/N ratios thereof are equal to or greater than 4.0 and is further preferable to determine defects as being defective in a case in which the S/N ratios thereof are equal to or greater than 2.0 in the PL inspection process.

If defects are determined to be defective in the case in which the S/N ratios are equal to or greater than 4.0, it is possible to remove at least defects that may lead to oxide film breakage. If defects are determined to be defective in the case in which the S/N ratios are equal to or greater than 2.0, it is possible to remove defects that may lead to oxide film breakage and defective electric strength.

(Gate Oxide Film Formation Process)

After the defective location is specified through the aforementioned inspection, a gate oxide film formation process is performed. In the gate oxide film formation process, the SiC epitaxial wafer is heated at a predetermined temperature in an atmosphere containing oxygen, for example. Both the surfaces of the epitaxial wafer are thermally oxidized through the heating. A gate electrode is formed on a gate oxide film, thereby obtaining a SiC device.

(Electric Strength Measurement Process)

A voltage may be applied to each SiC device produced on the SiC epitaxial wafer to further perform electric strength measurement. In the electric strength measurement, a predetermined voltage is applied between a rear-surface pad electrode and a source pad electrode. It is possible to specify a defect, which cannot be specified in the surface inspection process and the PL inspection process, by performing the electric strength measurement process.

According to the evaluation method for a SiC device and the manufacturing method for a SiC device in the embodiment, it is possible to determine a killer defect that may become a reason of oxide film breakage and defective electric strength as described above. It is difficult to accurately perform determination merely through PL inspection using photoluminescence. On the contrary, it is possible to determine a killer defect that may become a reason of oxide film breakage and defective electric strength with accuracy by checking the surface defect image and the PL defect image in the evaluation method for a SiC device and a manufacturing method for a SiC device according to the embodiment.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A manufacturing method for a SiC device, comprising:
performing an ion implantation process of implanting ions in an epitaxial layer of a SiC epitaxial wafer that has the epitaxial layer; and
performing an evaluation process of evaluating a defect of the SiC epitaxial wafer after the ion implantation process,
wherein the evaluation process includes
a surface inspection process of inspecting a surface of the SiC epitaxial wafer,
a photoluminescence inspection process of irradiating a region that includes the defect detected in the surface inspection with excitation light to perform photoluminescence measurement after the surface inspection process, and
a determination process of determining a degree of the defect from a surface defect image detected in the surface inspection and a photoluminescence defect image detected in the photoluminescence inspection process,
wherein in the photoluminescence inspection process, the defect evaluated in the evaluation process is determined as being defective in a case in which a ratio between luminance S at a light emitting portion that emits light and light emitting intensity N at a light non-emitting portion that does not emit light is equal to or greater than 4.0.

2. The manufacturing method for a SiC device according to claim 1, further comprising:
performing an electric strength measurement process of applying a voltage to each produced SiC device to perform electric strength measurement after the evaluation process.

3. The manufacturing method for a SiC device according to claim 2, wherein in the photoluminescence inspection process, the defect evaluated in the evaluation process is determined as being defective in a case in which the ratio between the luminance S at the light emitting portion that emits light and light emission intensity N at the light non-emitting portion that does not emit light is equal to or greater than 2.0.

4. The manufacturing method for a SiC device according to claim 1, wherein in the photoluminescence inspection process, the defect evaluated in the evaluation process is determined as being defective in a case in which the ratio between the luminance S at the light emitting portion that emits light and light emission intensity N at the light non-emitting portion that does not emit light is equal to or greater than 2.0.

5. An evaluation method for a SiC device, comprising:
performing a surface inspection process of inspecting a surface of a SiC epitaxial wafer;
performing a photoluminescence inspection process of irradiating the surface of the SiC epitaxial wafer with excitation light to perform photoluminescence measurement; and
performing a determination process of determining a degree of defect from a surface defect image detected in the surface inspection and a photoluminescence defect image detected in the PL inspection process,
wherein in the photoluminescence inspection process, the defect evaluated in the evaluation process is determined as being defective in a case in which a ratio between luminance S at a light emitting portion that emits light and light emitting intensity N at a light non-emitting portion that does not emit light is equal to or greater than 4.0.

6. The evaluation method for a SiC device as claimed in claim 5,
wherein in the photoluminescence inspection process, the defect evaluated in the evaluation process is determined as being defective in a case in which the ratio between the luminance S at the light emitting portion that emits light and light emission intensity N at the light non-emitting portion that does not emit light is equal to or greater than 2.0.

* * * * *